(12) United States Patent
Aston

(10) Patent No.: US 7,362,046 B2
(45) Date of Patent: Apr. 22, 2008

(54) PARTIAL OVERLAPPING DISPLAY TILES OF ORGANIC LIGHT EMITTING DEVICE

(75) Inventor: Mark Aston, Bromley (GB)

(73) Assignee: Image Portal Limited, Nottingham (GB)

( * ) Notice: Subject to any disclaimer, the term of this patent is extended or adjusted under 35 U.S.C. 154(b) by 477 days.

(21) Appl. No.: 10/813,541

(22) Filed: Mar. 29, 2004

(65) Prior Publication Data

US 2004/0256977 A1 Dec. 23, 2004

Related U.S. Application Data

(63) Continuation-in-part of application No. 10/026,919, filed on Dec. 21, 2001, now abandoned.

(51) Int. Cl.
*H01J 63/04* (2006.01)
(52) U.S. Cl. .................. 313/498; 313/504; 313/512
(58) Field of Classification Search ........... 313/498, 313/504, 512; 349/73
See application file for complete search history.

(56) References Cited

U.S. PATENT DOCUMENTS

| | | | |
|---|---|---|---|
| 3,631,251 A | | 12/1971 | Lehovec |
| 5,673,091 A | * | 9/1997 | Boisdron et al. ........... 349/58 |
| 5,821,002 A | | 10/1998 | Ohnishi et al. |
| 5,867,236 A | | 2/1999 | Babuka et al. |
| 5,929,572 A | | 7/1999 | Whitesell |
| 5,956,000 A | | 9/1999 | Kreitman et al. |
| 6,140,765 A | | 10/2000 | Kim et al. |
| 6,198,220 B1 | | 3/2001 | Jones et al. |
| 6,201,346 B1 | | 3/2001 | Kusaka |
| 6,262,441 B1 | | 7/2001 | Boler et al. |
| 6,264,805 B1 | | 7/2001 | Forrest et al. |
| 6,459,418 B1 | | 10/2002 | Comiskey et al. |
| 2002/0050782 A1 | | 5/2002 | Ito et al. |
| 2002/0074937 A1 | * | 6/2002 | Guberman et al. ......... 313/511 |
| 2002/0118320 A1 | * | 8/2002 | Bayrle et al. ................. 349/73 |
| 2003/0043316 A1 | * | 3/2003 | Matsumoto et al. .......... 349/84 |
| 2004/0252113 A1 | * | 12/2004 | Vicentini et al. ........... 345/205 |
| 2005/0110702 A1 | * | 5/2005 | Aoki et al. .................. 345/30 |
| 2005/0140610 A1 | * | 6/2005 | Smith et al. ................. 345/77 |

FOREIGN PATENT DOCUMENTS

| | | |
|---|---|---|
| EP | 0986112 | 3/2000 |
| EP | 1 143 772 A1 | 10/2001 |
| WO | PCT/US99/15954 | 1/2000 |
| WO | PCT/SG99/00073 | 1/2001 |

OTHER PUBLICATIONS

G. Rejeswaran, et al; "Active matrix Low Temperature Poly-Si TFT/OLED Full Color Displays: Development Status"; 2000; pp. 1-4; SID 00 Digest.

J.K. Mahon; "Invited Paper: History and Status of Organic Light Emitting Device (OLED) Technology for Vehicular Applications"; 2001; pp. 22-25; SID 01 Digest.

* cited by examiner

*Primary Examiner*—Joseph Williams
*Assistant Examiner*—Hana A Sanei
(74) *Attorney, Agent, or Firm*—Jones, Walker, Waechter, Poitevent, Carrere, & Denegre, L.L.P.

(57) ABSTRACT

Display 100 has three adjacent display tiles 10, each having a mould plastics support 11, a glass panel 12 incorporating the OLED element and an interface pcb 17. These tiles 10 form part of a full-color advertising screen of dimensions 1.2 meter by 1.8 meter, used in indoor public places.

34 Claims, 10 Drawing Sheets

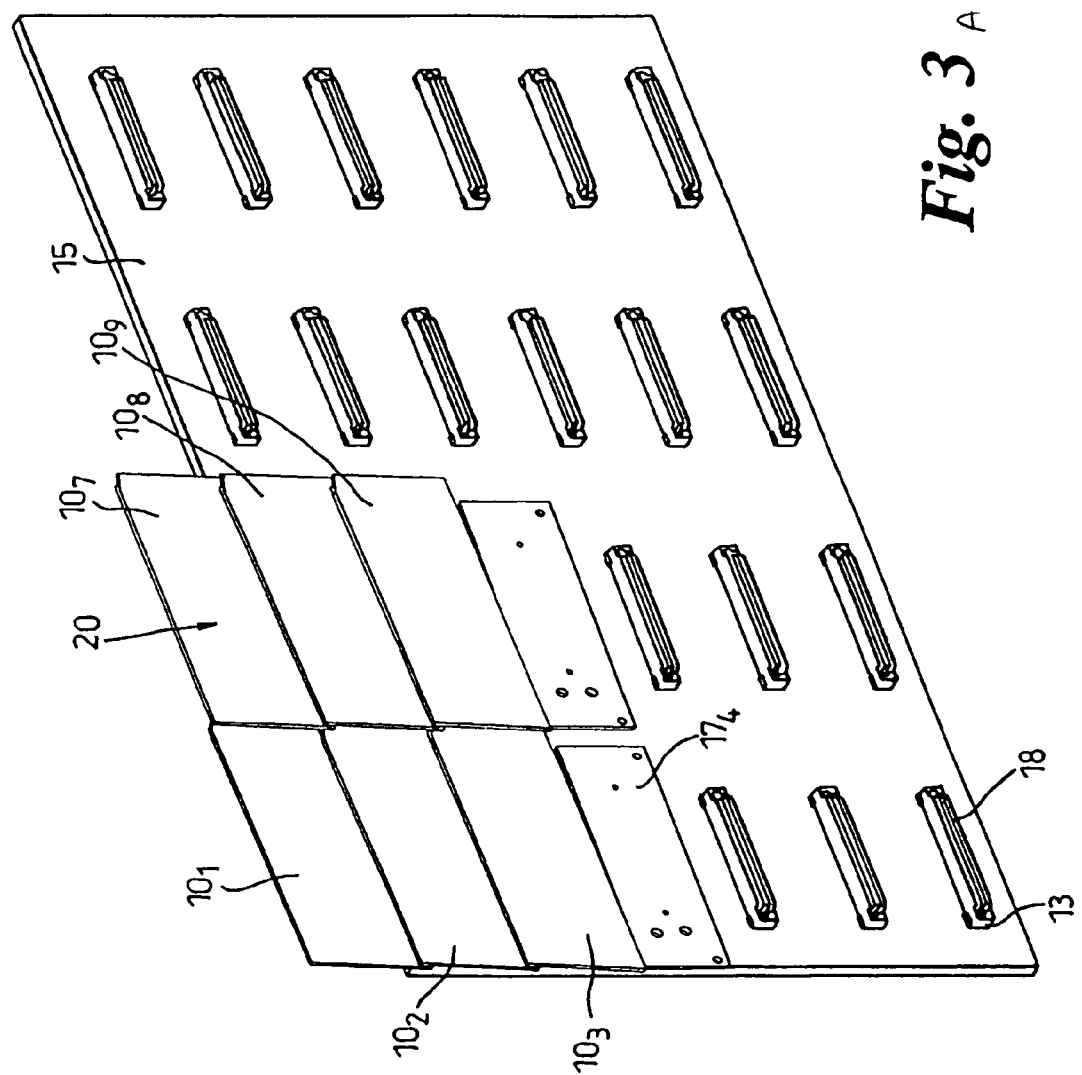

PARTIAL OVERLAPPING DISPLAY TILES OF ORGANIC LIGHT EMITTING DEVICE

"This application is a continuation-in-part of U.S. application Ser. No. 10/026,919, filed on 21 Dec. 2001, now abandoned which claims priority to United Kingdom application serial number 0127090.9, filed on 10 Nov. 2001, which is hereby incorporated by reference in its entirety."

BACKGROUND OF THE INVENTION

1. Field of Invention

The present invention relates to a display, especially a display incorporating an array of OLED pixels, or an OLED backlight used in conjunction with an array of LCD pixels, or an array of pixels formed from electronic paper.

2. Description of Related Art

Existing types of display units (whether incorporating cathode ray tubes, liquid-crystal displays or plasma panels) have a region of no display along their perimeter. Thus, when display units of a given type are bolted together to form larger display, these dead-areas are plainly visible, dividing up the resultant screen into a grid, thereby limiting the overall effect of the composite screen.

In the last few years, displays incorporating OLED (Organic Light Emitting Device) material have been developed for use in automotive dashboards, instrument panels and car radios in order to make good use of the known characteristics of good power efficiency, thermal stability and extended lifetime.

A passive matrix display comprises an array of active display elements (pixels), which are addressed by a transparent front plane of electrical tracks and a metal rear plane of electrical tracks. The front and rear planes of tracks are orthogonal to each other and, by switching on one row at a time, display data can be sent to the corresponding column. Switching this row off and switching the next row on with its corresponding column data builds up a continuous picture over the area of the display as each row is cycled on and off, provided that the rate at which the entire display is updated is less than 1/50th of a second. This is a relatively cheap and easy display to make.

An active matrix display utilises transistors as part of each display pixel in a screen. The transistors can be independently controlled, and switch each pixel on or off independently of it's neighbours. This is a more costly alternative to passive addressing, though gives better quality displays when used with LCD technology.

SUMMARY OF THE INVENTION

The present invention provides a display comprising a plurality of display tiles, each tile comprising a portion to support a display region incorporating an Organic Light Emitting Device (OLED) material with a plurality of separately addressable pixel elements, wherein the portion is at a tilt angle θ to the main plane of the display, wherein:

$$\theta = \tan^{-1}\left[\frac{\sqrt{l^2 + w^2}}{3t}\right]$$

l being the tile length, w being the tile width and t being the tile thickness.

Thus, a second portion of a display tile which may be underneath an adjacent first portion is not visible to a viewer of the display, so that that portion can be used for wiring connections and leads to that display region without causing any detrimental effect to the overall appearance of the display.

Furthermore, the display area may be arranged to have multiple overlapping tiles. Thus, preferably, the display array comprises a plurality of display regions of the pixels which overlie part of the display regions of laterally and/or orthogonally adjacent display regions.

Various embodiments of the display may include one or more of the following features:

- the tilt angle θ comprises a compound tilt angle $\theta_c$ having a horizontal tile angle $\theta_h$ and a vertical tile angle $\theta_v$;
- the first portion is at a compound tilt angle $\theta_c$ which is less than 12°.
- the first portion is at a compound tilt angle $\theta_c$ which is in the range 0.5° to 12°.
- the first portion is at a compound tilt angle $\theta_c$ which is in the range 0.5° to 6°.
- the first portion is at a compound angle $\theta_c$ in the range 3.0° to 3.4°.
- the first portion is at a horizontal tilt angle $\theta_h$ of less than 3°.
- the first portion is at a vertical tilt angle $\theta_v$ of less than 3.5°.
- the first portion and the second portion of a tile are in substantially parallel planes.
- the first and second portions of a tile are in a stepped relationship.
- the first and second portions of a tile are arranged generally in a U-shape.
- the second portion incorporates wiring and/or electrical connections.
- the first portion comprises a tile to hold a glass panel of OLED panel.
- the first portion comprises a moulded holder of plastic material.
- heat seal means to ensure high integrity connection of the display to drive electronics.
- the pixel elements have integral means to generate illumination.
- means to effect back lighting illumination of a plurality of pixel elements.
- a plurality of display regions, each incorporating Organic Light Emitting Device (OLED) material, each region comprising:
  a. a plurality of separately addressable pixel elements; and
  b. one or more of the display region(s) overlying a portion of one of more adjacent display region(s) wherein the first portion and the second portion of a tile are not in the same plane.
- one or more further display regions overlie part of another display region(s).
- portions of display areas which lie underneath other display areas incorporate at least one of wiring or electrical connections.
- a plurality of display regions which overlie part of a display region of at least one of a laterally or orthogonally adjacent display region.
- the display regions form a substantially continuous display surface over the array.
- the display regions form a plurality of OLED pixel array tiles.
- a plurality of LCD tiles use an OLED backlight.
- a display tile comprises a passive matrix display device.
- a plurality of electronic paper tiles.

the main plane of the display comprises a plane incorporating the nearest point of each OLED display first portion to an observer of the display.

The first portion and the second portion of a display tile are not in the same plane;

A flexible heat seal means to ensure high integrity electrical connections between drive electronics and said pixels.

The term "Compound Angle" refers to the tilt angle of a first portion with respect to the main plane, typically having non-zero vertical and/or horizontal components.

The present invention is particularly suited to displays for advertising screens in public places, and to displays for customer information at train or bus stations and airports, typically with screens up to 3 metres by 2 metres.

However the present invention is also suited to applications incorporating displays which are smaller or larger than these applications; also, the present invention is suited to displays which are of any appropriate shape, for example square or rectangular or have an complex outline, for example L-shaped and the perimeter may have sides which are straight and/or arcuate.

The present invention is applicable to displays in which illumination is provided solely by the material and also displays in which back-lighting of the display is provided. Thus, the present invention includes embodiments wherein the pixel elements operate as a shutter whether solely with the on/off capability or with also a graded grey-scale capability.

BRIEF DESCRIPTION OF THE DRAWINGS

In order that the invention may more readily be understood, a description is now given, by way of example only, reference being made to the accompanying drawings, in which:

FIG. 3a is a view of part of the front of the display of FIG. 2a;

DETAILED DESCRIPTION OF THE INVENTION

Figure 1:
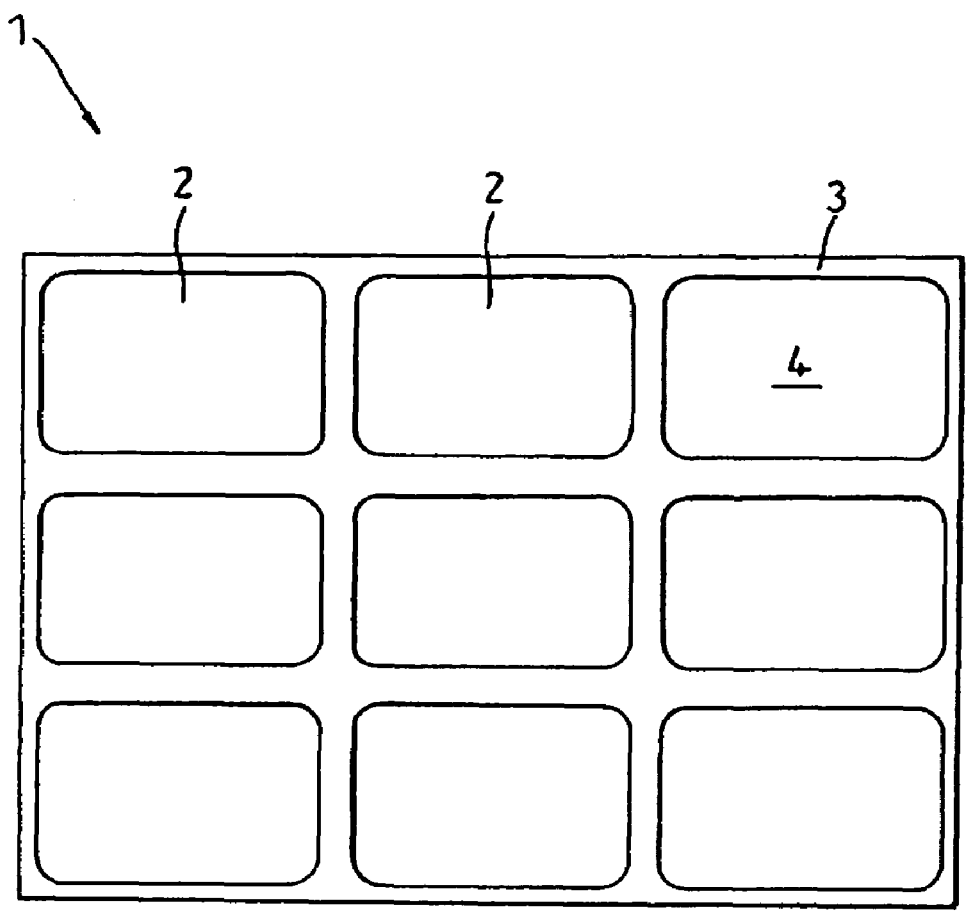
FIG. 1 is a schematic view of part of a conventional tiled display.
Figure 2A:
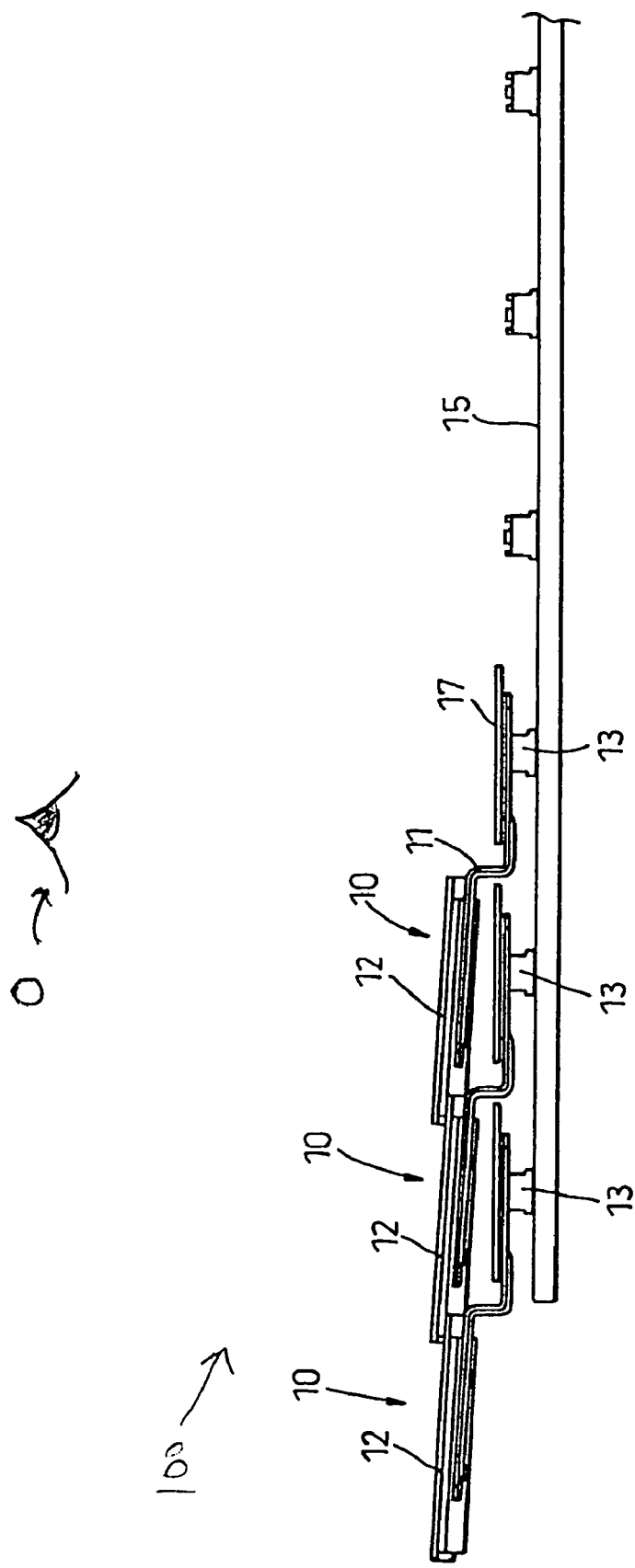
FIG. 2a is a side view of a number of adjacent elements of a display embodying the present invention.
Figure 2B:
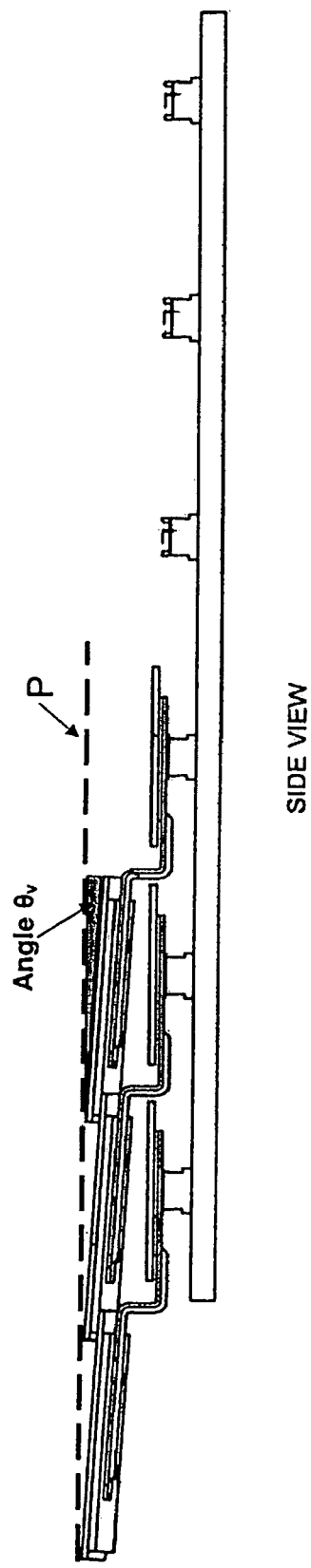
FIG. 2b is a side view similar to FIG. 2a but showing the angle $\theta_v$ of vertical tilt.
Figure 2C:
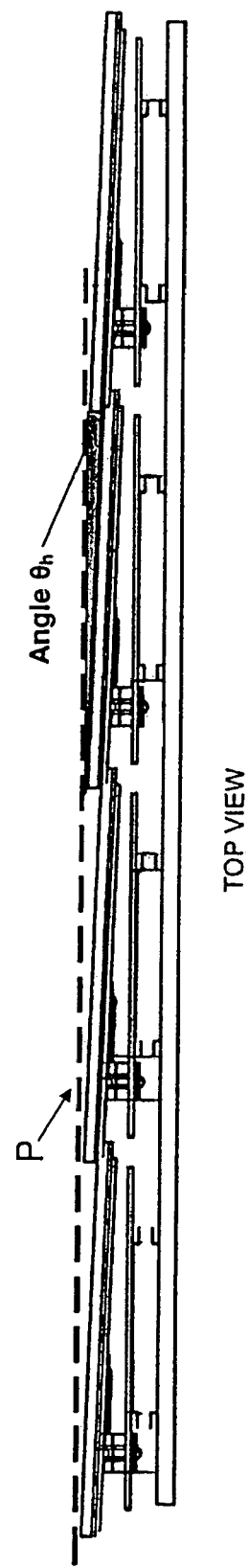
FIG. 2c is a view from above showing the angle $\theta_h$ of horizontal tilt.
Figure 2D:
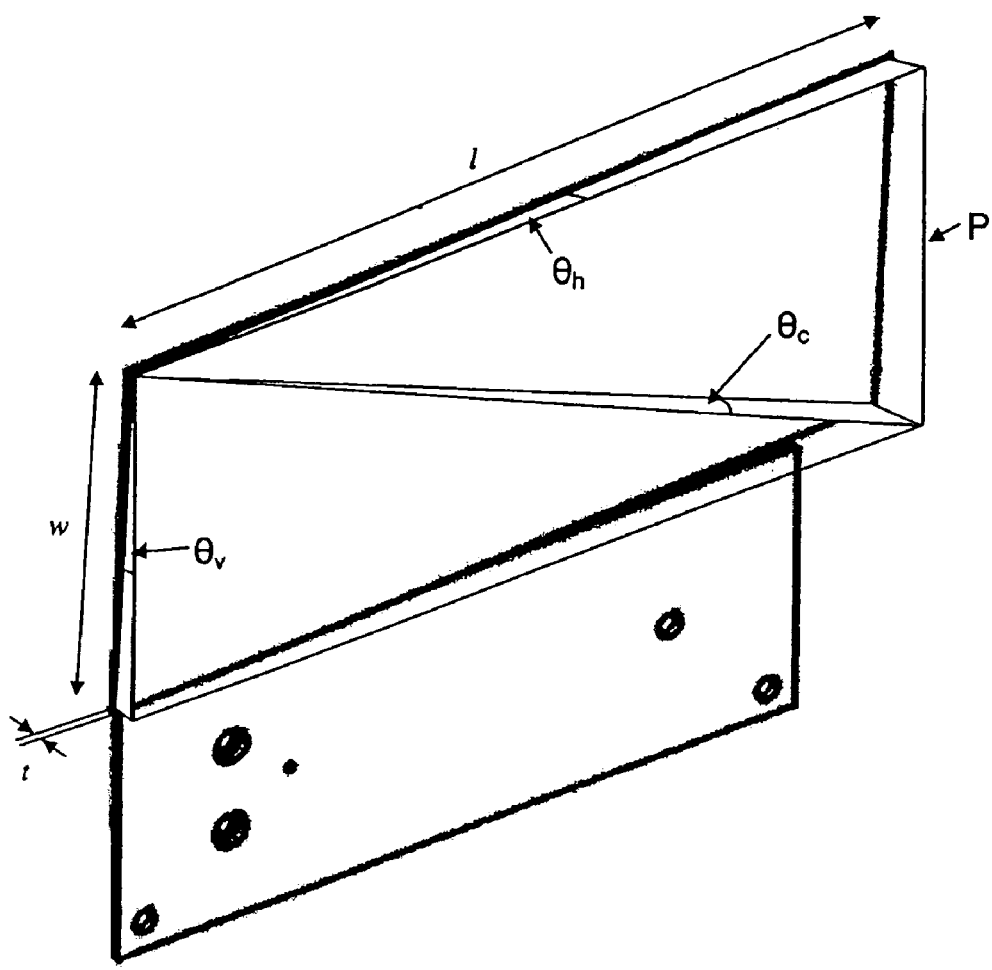
FIG. 2d shows the compound angle $\theta_c$.

FIG. 1 illustrates the inherent problem with attempts to form a larger display 1 using discrete displays 2 incorporating known technologies for example cathode ray tubes, liquid crystals and plasma panels. All these technologies have dead areas 3 surrounding the areas 4 which actually represent the image being displayed such that, when a number of displays 2 are bolted together to form the larger display, 1 the dead areas from adjacent displays 2 combine together and become plainly visible, effectively dividing up the screen into a grid array thereby seriously deteriorating the overall effect of the display 1 and detracting from the appearance of the image being displayed.

Figure 4:
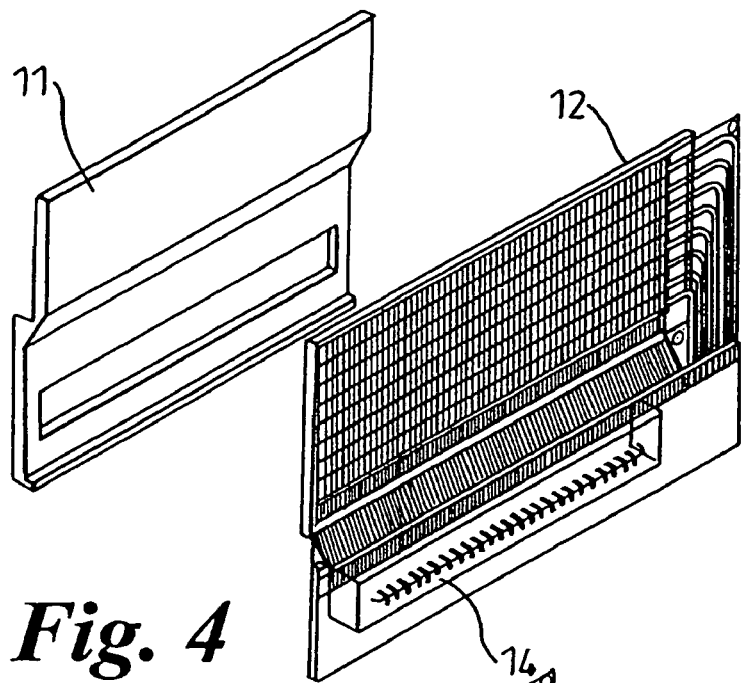
FIG. 4 is a perspective exploded view of an element of FIG. 2.

There is shown in FIG. 2 part of a display 100 as viewed by an observer O and formed from an arrangement of three adjacent display tiles 10, each having a moulded plastics support 11, a glass panel 12 incorporating the OLED element (see FIG. 4) and an interface printed circuit board (pcb) 17. These tiles 10 form part of a full-colour advertising screen of dimensions 1.2 metre by 1.8 metre, used in indoor public places.

Another application for such a display is a Customer Information display, for example for use in train stations, bus stations and airports. The display screen is of any size and shape, from one-character rows to display screens up to typically 3 metre by 2 metre. The pixel element size is typically in the range of 1 to 10 mm for example 3 mm, and the pixels may be of any colour combination.

The three display tiles 10 are overlapped to eliminate the grid effect, and held in place by mechanical (in the form of posts 13) and electrical interfaces (in the form of electrical connectors 14 and sockets 18) that mount each display tile 10 onto a motherboard 15. The motherboards 15 may also be tiled within a casing to build up screens of virtually any shape and size. The design allows for display tiles on one motherboard to overlap with tiles on the second motherboard in the same manner as with each tile on a motherboard.

Figure 3B:
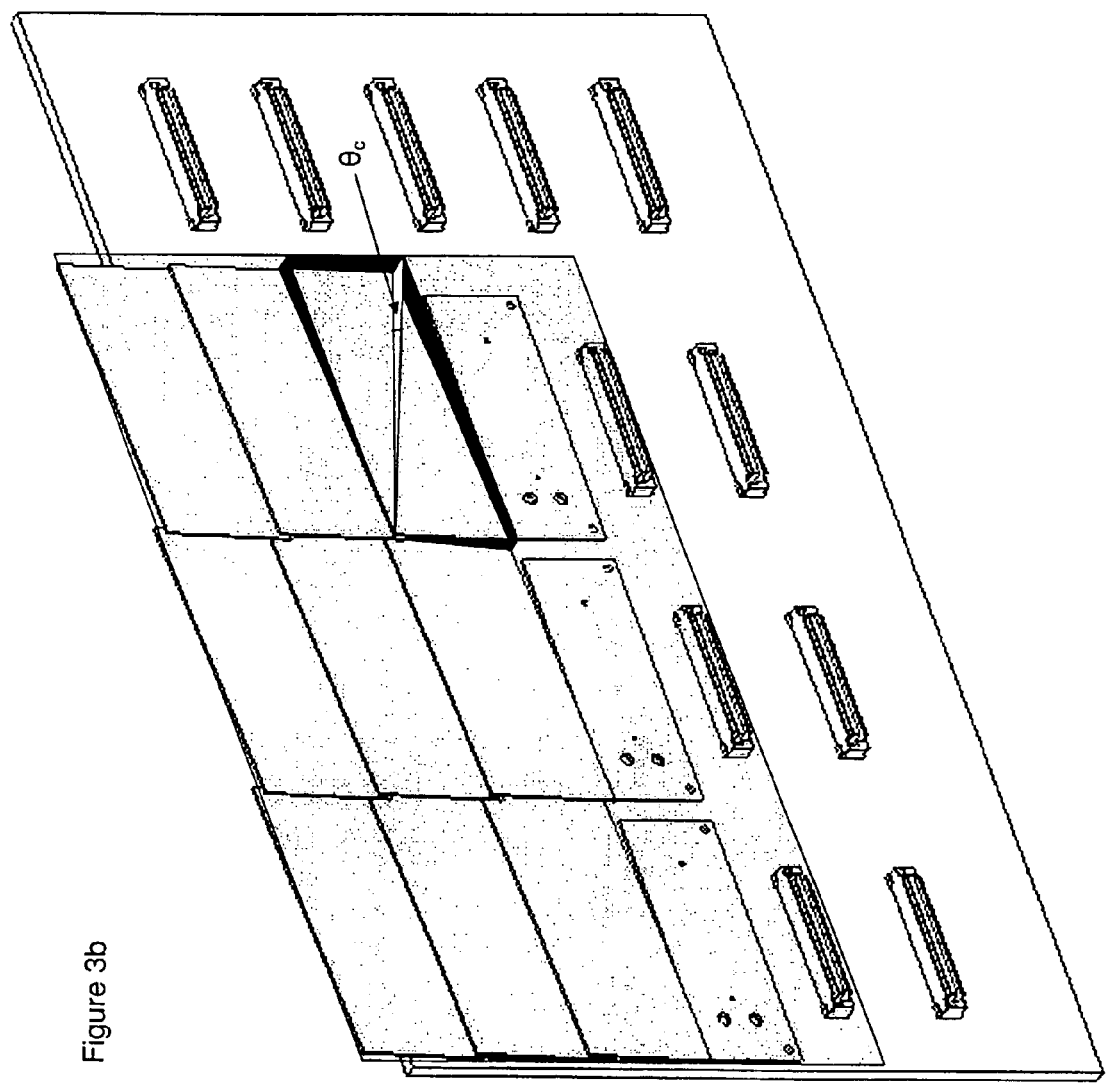
FIG. 3b shows the compound angle $\theta_c$.

In this way, dead areas surrounding the active pixel area displayed and necessary to accommodate wiring and/or electrical leads for driving of the pixel elements are hidden behind active image areas, this being made possible by the thin characteristic of OLED devices. The resultant overlap reduces the grid effect seen on other tiled large area displays to a negligible level. This technique can be applied to OLED pixel array tiles, to LCD tiles using an OLED backlight, or to tiles of electronic paper technology. Each glass panel 12 of a display tile 10 is 73.8 mm wide, 33 mm high, and 1.7 mm thick oriented as shown in FIG. 3, and 1500 tiles are combined together to form a display area of approximately 1.2 by 1.8 metres.

The provision of support 11 of the illustrated form allows display tile 10 to be mounted in such manner as to provide a compound angle of tilt with respect to a plane P, the tilt introduced by overlapping tiles on the bottom and right hand edges on the front face to allow tiling of a number of supports 11. Support 11 holds the glass panel 12 and a connector/printed circuit board provides the compound angle $\theta_c$ necessary to stack and tile the OLED panels.

In one embodiment, the compound angle $\theta_c$ is 3.2° with a manufacturing tolerance of +/−0.1° formed of a vertical tilt angle $\theta_v$ (see FIG. 2b) being 2.9° and a horizontal tilt angle $\theta_h$ (see FIG. 2c) being 1.3°, where P is the plane containing the nearest point of each panel 12 to given observer O of the display unit 100.

Thus the plane of each OLED tile is parallel with the plane of every other tile in the display, but intercepts the plane P defined as containing each tile's nearest point to the viewer at the horizontal tilt $\theta_h$ angle, and the vertical tilt angle $\theta_v$. A viewer of the screen would normally look at the display in a direction perpendicular to the plane containing the nearest point on each tile to the viewer, and perceive this plane as the "front" of the screen, while each OLED tile is actually mounted at the defined compound angle $\theta_c$ to this plane.

In the present invention, compound angle $\theta_c$ allows near-seemless tiles of OLED tiles to form a larger display by sliding adjacent tiles over and under the side of their neighbours. This affords less gap between edge pixels in each neighbouring tile and produces a display screen which has the appearance of a more continuous display as seen by the viewer than would be possible if the tiles were merely butted edge to edge.

The present invention also avoids the need to tile a complete display via a lamination process, allowing for an easier display assembly and maintenance process.

The compound angle introduced as a result of the tiling of OLED tiles is preferably limited to less than 12°. If greater angles are employed, the quality of the overall display as viewed tends to suffer, due to the large compound angle introducing a dislocation, or apparent discontinuity, of the image across neighbouring tiles. For this reason, compound angles of 6° or less are advantageously used in the more preferred embodiments of the display.

The actual compound tilt angle $\theta_c$ introduced in the tiling technique is dependant upon the length and breadth of the OLED tiles, as well as their thickness. The tiling technique could be used for any size, shape and thickness of OLED tile, providing that the target maximum compound angle is not exceeded.

Advantageously, the tilt angle $\theta$ to the main plane of the display is defined as $$\theta = \tan^{-1}\left[\frac{\sqrt{l^2 + w^2}}{3t}\right]$$

l being the tile length, w being the tile width and t being the tile thickness, preferably this tile angle $\theta$ as so defined being a compound angle $\theta_c$ having a vertical tilt angle $\theta_v$ and a horizontal tilt angle $\theta_h$. However, clearly it is possible for the tilt angle $\theta$ to have only a vertical angle $\theta_v$ or only a horizontal tilt angle $\theta_h$.

The dimensions presented in the present invention represent a cost-effective manufacturing component, that can successfully be driven in Passive Matrix form, and still meets the criteria for an acceptable compound angle.

The design and dimensions of display tile 10, support 11 and panel 12 as illustrated is such that the overall thickness of the display unit 100 is uniform over the whole surface area of the display unit 100 while the adjacent display tiles 10 are arranged in an overlapping configuration to hide non-display areas of panels 12 and to provide a seemingly continuous display over a wide range of viewing angles.

A heat seal connector (not shown) is arranged in a "L" shape to attach to the bottom and right hand sides of the OLED glass panels 12. These may be any two adjacent sides of the device depending upon which orientation the compound angle and panel overlap is required. If the top and left hand side form heatseal connections instead of the bottom and right hand sides, the overlapping will take place around the new position of the heatseal connections.

FIG. 3 illustrates part of the display screen 20 formed by a 2-dimensional matrix of display tiles. In order to assemble the tiles onto a motherboard 15, the following steps are taken: interface pcb $17_1$, is placed on the post $13_1$, at the top left-hand-most position on the motherboard 15, then the corresponding tile $10_1$, is placed on the interface pcb $17_1$.

Thereafter, the same actions are taken in respect of interface pcb $17_2$, post $13_2$ and tile $10_2$ for the next position vertically below but in the same column, and so on until the first column is filled. Then the sequence is repeated for the second column, starting at the top and finishing at the bottom, and being repeated for each column in turn.

In a variant, the tiles 10 are assembled row, by row starting from the top lefthand corner.

Figure 5:
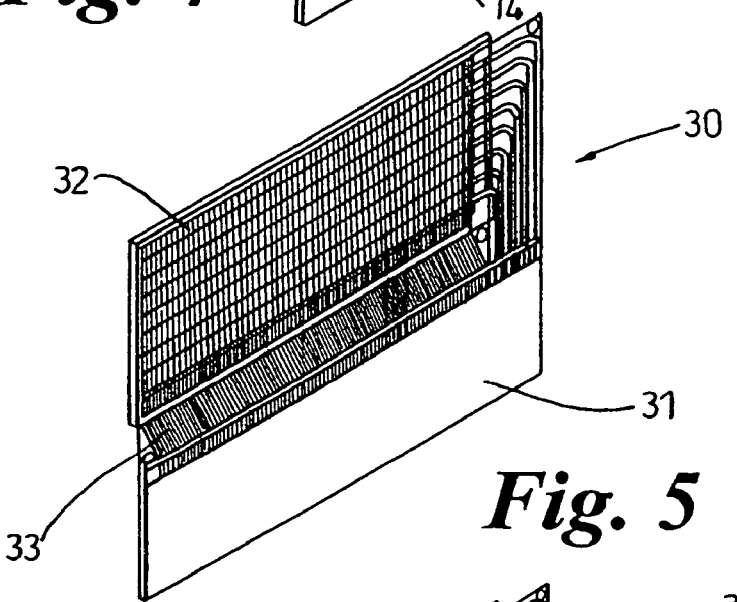
FIG. 5 is a perspective view of a second embodiment of an element in a first state.
Figure 6:
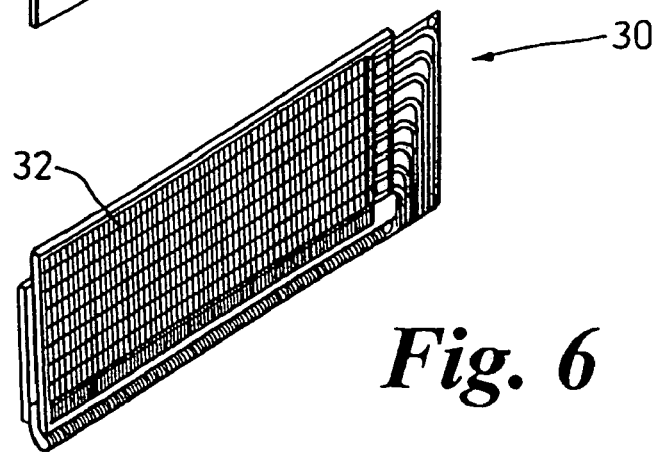
FIG. 6 is a perspective view of a second embodiment of an element in a second state.

In an alternative embodiment of display tile 30, printed circuit board 31 is folded under the glass OLED panel 32 (see FIGS. 5 and 6), a modified moulded plastics support 33 providing the required compound angle and holding the printed circuit board 31 which is appropriately dimensioned to ensure that there is no conflict with other printed circuit boards from adjacent tiles 30.

In a further alternative embodiment, there is no printed circuit board and connector, the heatseal is plugged directly into the motherboard, removing the need of a separate connector and making the arrangement more cost effective and producing a thinner screen.

Figure 7:
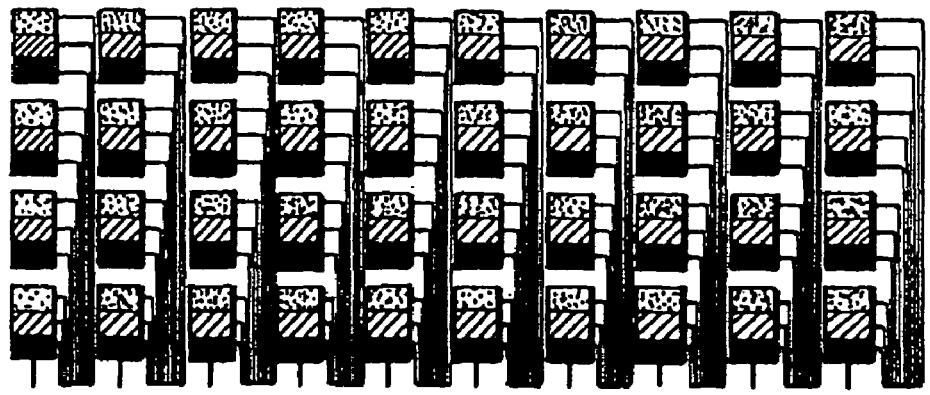
FIG. 7 is an example of one pixel shape and direct-addressing arrangement for use in the display of the present invention.
Figure 8:
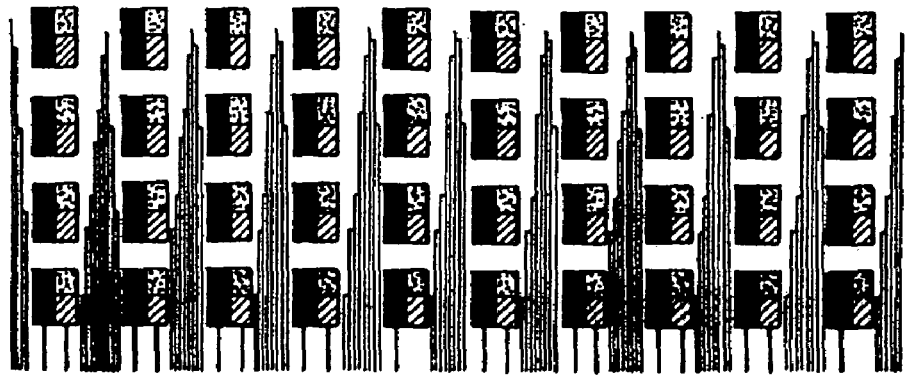
FIG. 8 is an example of another pixel shape and direct-addressing arrangement for use in the display of the present invention.
Figure 9:
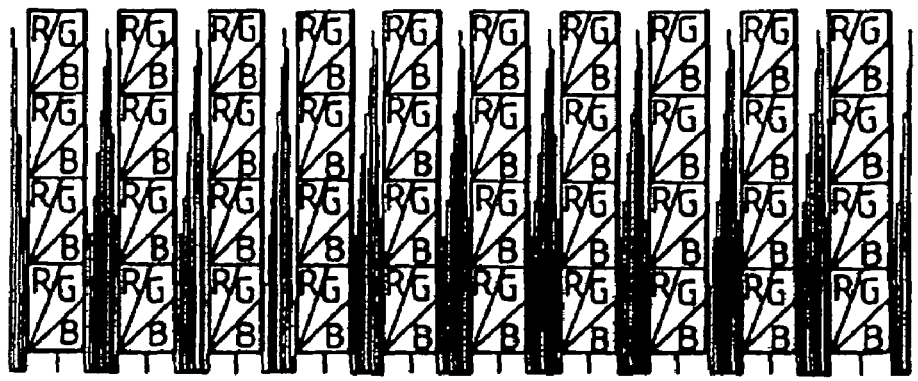
FIG. 9 is an example of yet another pixel shape and direct-addressing arrangement for use in the display of the present invention.

For direct pixel addressing applications, only one side of the OLED glass panels 12 is required for heatseal bonding, to accommodate the tracking in-between the active pixels. FIGS. 7 to 9 show some of the possible arrangements for direct addressing.

A display tile 10 is not reliant upon any particular defined pixel layout. In order to produce full colour displays, it is necessary to use red, green and blue pixel elements as a minimum. There may also be cases where a further white element is used to increase the white saturation of the image. For the backlight application, any colour or areas of colour may be used.

Pixel element shapes may be square, rectangular, circular, triangular, oval or indeed any geometric form and size. The size of the red, green, blue (and white, if included), are in the range of 1 mm pixel pitch to 15 mm pitch, though the present invention is not limited to any pixel size, shape or arrangement. Dimensions of the backlighters for those embodiments are the same as the particular size of LCD tile used for the application.

Figure 10:
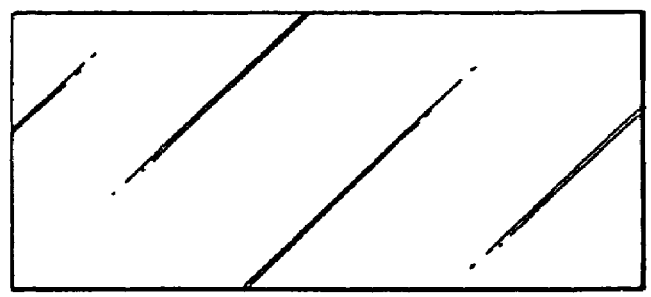
FIG. 10 shows the glass substrate for the display of FIG. 2.

FIG. 10 shows a colour pixel OLED glass panel 12 formed from a glass substrate being a rectangular section of glass, 0.7 mm thick. The dimensions of the glass are illustrated below, including the positioning of the first upper left-hand corner of the pixel array.

Upon the glass substrate, the device is built up in the following layers:
1. ITO anode
2. Organic stack (pixels)
3. Metal cathode
4. Encapsulation All of the tracks are 1 mm wide and fall directly onto the vertical layout of the pixels (organic stack). The ITO tracks comprise groups of three 1 mm tracks, each track being 0.1 mm apart, with each group of three being 0.2 mm apart. The first track on the left-hand side starts in the same location as indicated for the pixels on the definition of the glass substrate.

Figure 11:
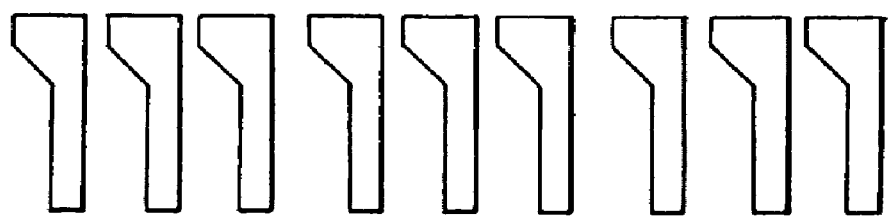
FIG. 11 shows the tracking for the display of FIG. 2.

The length of each track is 27.2 mm, such that each track is visible by 0.2 mm below the bottom row of pixels. In the next 0.8 mm, the tracking is reduced in width gradually until it is 0.5 mm. In the remaining 2 mm of glass, the tracks are bunched together to form 0.5 mm ITO with 0.6 mm gap in a RGB group of 0.7 mm in-between RGB groups. This is repeated for the entire length of the new connector region (see FIG. 11).

Figure 12:
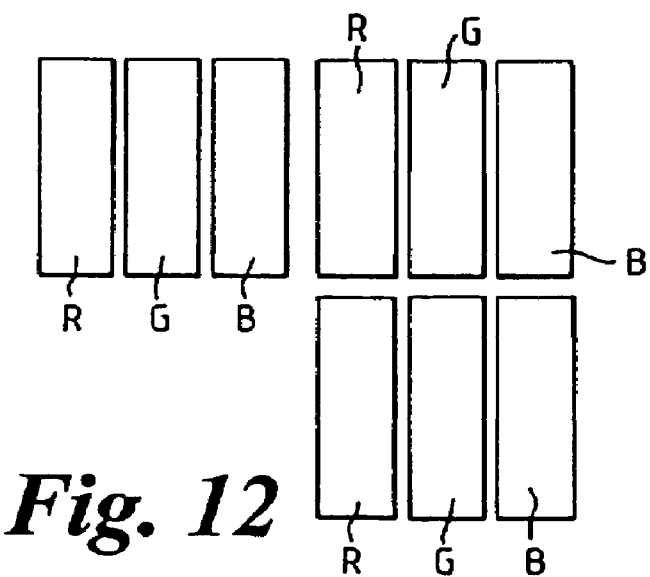
FIG. 12 shows the pixel layout for the display of FIG. 2.
Figure 13:
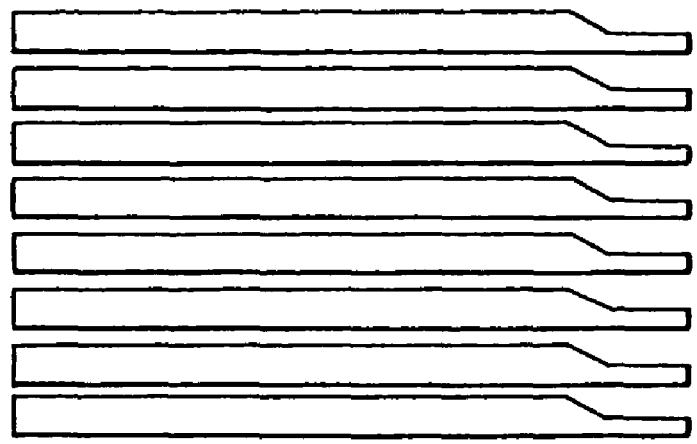
FIG. 13 shows the metal cathode configuration for the display of FIG. 2.
Figure 14:
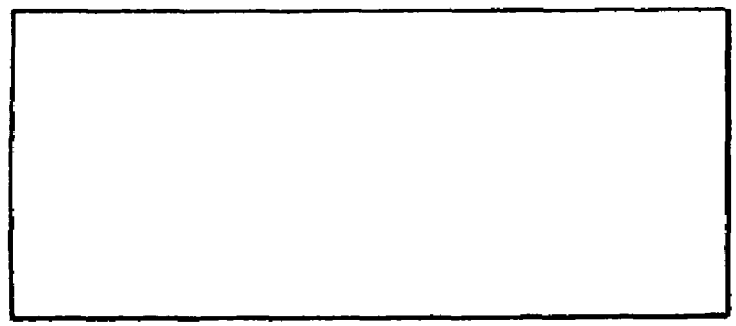
FIG. 14 shows the encapsulation for FIG. 2.
Figure 14:
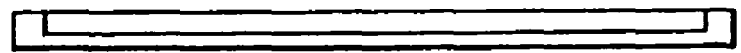

The pixels are formed into an array of 20×8 (67.8 mm×27 mm). The pixel pitch is 3.4 mm, with a fill-factor of 83% (see FIG. 12). The metal cathode layer comprises no more that eight strips each 3.2 mm wide, 0.2 mm apart, starting in exactly the same place at the top left-hand pixel (see FIG. 13). This time, the tracking protrudes 0.2 mm from the edge of the last column of pixels, reducing from 3.2 mm to 1 mm width within 0.8 mm and remaining a constant 1 mm width for the remaining 2 mm until the edge of the glass is reached. The encapsulation is located 1 mm in from the top and 1 mm from the left side of the glass substrate.

The invention claimed is:

1. A display comprising a plurality of display tiles, each tile comprising a portion to support a display region incorporating an Organic Light Emitting Device (OLED) material, said OLED material comprising a plurality of separately addressable pixel elements, wherein the portion is at a tilt angle $\theta_c$ of less than 12° to the main plane of the display wherein:

$$\theta_c = \tan^{-1}\left(\frac{\sqrt{l^2 + w^2}}{3t}\right)$$

l being the tile length, w being the tile width and t being the tile thickness.

2. A display comprising a plurality of display tiles, each tile comprising a portion to support a display region incorporating an Organic Light Emitting Device (OLED) material with a plurality of separately addressable pixel elements, wherein the portion is at a tilt angle θ to the main plane of the display comprising a compound angle $\theta_c$, having a nonzero horizontal tilt angle $\theta_h$ and a nonzero vertical tilt angle $\theta_v$, wherein:

$$\theta_c = \tan^{-1}\left(\frac{\sqrt{l^2 + w^2}}{3t}\right)$$

l being the tile length, w being the tile width and t being the tile thickness.

3. A display according to claim 2 wherein the portion is at a compound tilt angle $\theta_c$, which is in the range 0.5° to 12°.

4. A display according to claim 2 wherein the portion is at a compound tilt angle $\theta_c$, which is in the range 0.5° to 6°.

5. A display according to claim 2 wherein the portion is at a compound angle $\theta_c$ in the range 3.0° to 3.4°.

6. A display according to claim 2 wherein the portion is at a horizontal tilt angle $\theta_h$ of less than 3°.

7. A display according to claim 2 wherein the portion is at a vertical tilt angle $\theta_v$ of less than 3.5°.

8. A display according to claim 2 wherein a first portion and a second portion of a tile are in substantially parallel planes.

9. A display according to claim 2 wherein a first and second portions of a tile are in a stepped relationship.

10. A display according to claim 2 wherein a first and second portions of a tile are arranged generally in a U-shape.

11. A display according to claim 2 wherein a second portion incorporates wiring and/or electrical connections.

12. A display according to claim 2 wherein the portion comprises a tile to hold a glass panel of an OLED element.

13. A display according to claim 2 wherein the portion comprises a moulded holder of plastic material.

14. A display according to claim 2 comprising heat seal means to ensure high integrity connection of the display to drive electronics.

15. A display according to claim 2 wherein the pixel elements have integral means to generate illumination.

16. A display according to claim 2 comprising means to effect back lighting illumination of a plurality of pixel elements.

17. A display according to claim 2 comprising a plurality of display regions, each incorporating Organic Light Emitting Device (OLED) material, each region comprising a plurality of separately addressable pixel elements.

18. A display according to claim 2 wherein one or more further display regions overlie part of another display region (s).

19. A display array according to claim 2 wherein portions of display areas which lie underneath other display areas incorporate at least one of wiring or electrical connections.

20. A display according to claim 2 comprising a plurality of display regions which overlie part of a display region of at least one of a laterally or orthogonally adjacent display region.

21. A display according to claim 2 wherein the display regions form a substantially continuous array over a display surface.

22. A display according to claim 2 comprising a plurality of OLED pixel array tiles.

23. A display according to claim 2 comprising a plurality of electronic paper tiles.

24. A display according to claim 2 wherein a substrate comprises a passive matrix display device.

25. A display according to claim 2 wherein the main plane of the display comprises a plane incorporating the nearest point of each OLED display first portion to an observer of the display.

26. A display comprising a plurality of display tiles, each of said display tiles further including:
 a. a support member;
 b. a printed circuit board positioned on said support member;
 c. a panel having an OLED element operatively connected to said circuit board at a compound tilt angle $\theta_c$ to the main plane of the display for the printed circuit board to underlie part of another tile, said compound tilt angle $\theta_c$, comprising a nonzero horizontal tilt angle $\theta_h$ and a nonzero vertical tilt angle $\theta_v$; and
 d. wherein said display tiles are positioned in an overlapping array to form a substantially three dimensional display.

27. A display comprising a plurality of display tiles forming a main plane of said display, each of said display tiles further comprising:
 a. a support member;
 b. an OLED element operatively connected to said support member at a compound tilt angle $\theta_c$ to said main plane of said display, said compound tilt angle $\theta_c$, comprising a nonzero horizontal tilt angle $\theta_h$, and a nonzero vertical tilt angle $\theta_v$; and c. wherein said display tiles are positioned such that said OLED elements are an overlapping array forming a substantially three dimensional display.

28. A display according to claim 27, wherein said compound tilt angle $\theta_c$ is in the range 0.5° to 6°.

29. A display according to claim 27, further comprising a plurality of display regions, each incorporating Organic Light Emitting Device (OLED) material, each region comprising a plurality of separately addressable pixel elements.

30. A display array according to claim 27, wherein portions of display areas which lie underneath other display areas incorporate at least one of wiring or electrical connections.

31. A display according to claim 27, wherein said display tiles overlie part of a display region of at least one of a laterally or orthogonally adjacent display tile.

32. A display according to claim 27, further comprising a plurality of electronic paper tiles.

33. A display according to claim 27, wherein a substrate comprises a passive matrix display device.

34. A display according to claim 27, wherein each tile comprises a portion to support a display region and the main plane of the display comprises a plane incorporating the nearest point of each OLED portion to an observer of the display.

* * * * *